United States Patent
Son

(10) Patent No.: US 8,921,817 B2
(45) Date of Patent: Dec. 30, 2014

(54) PHASE-CHANGE RANDOM ACCESS MEMORY DEVICE HAVING MULTI-LEVELS AND METHOD OF MANUFACTURING THE SAME

(75) Inventor: Min Seok Son, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 236 days.

(21) Appl. No.: 13/601,708

(22) Filed: Aug. 31, 2012

(65) Prior Publication Data
US 2013/0248805 A1   Sep. 26, 2013

(30) Foreign Application Priority Data
Mar. 20, 2012   (KR) .................. 10-2012-0028379

(51) Int. Cl.
*H01L 47/00* (2006.01)

(52) U.S. Cl.
USPC ................................. 257/4; 438/95

(58) Field of Classification Search
CPC ...... G11C 11/56; H01L 45/06; H01L 45/126; H01L 45/1233
USPC .................. 438/95; 257/E45.001, E21.004, 4
See application file for complete search history.

(56) References Cited

U.S. PATENT DOCUMENTS

| 2006/0113520 A1* | 6/2006 | Yamamoto et al. | ............. 257/3 |
| 2009/0261313 A1* | 10/2009 | Lung et al. | ............. 257/4 |

FOREIGN PATENT DOCUMENTS

| KR | 1020100118341 | 11/2010 |
| KR | 1020110076394 | 7/2011 |

* cited by examiner

*Primary Examiner* — Shaun Campbell
(74) *Attorney, Agent, or Firm* — IP & T Group LLP

(57) ABSTRACT

A phase-change random access memory (PCRAM) device and a method of manufacturing the same. The PCRAM includes a heating electrode having an upper surface protruding in a stepped shape and a phase-change material layer formed in a phase-change space on the heating electrode, the phase-change material layer having a plurality of portions having thicknesses corresponding to the stepped shape of the heating electrode.

14 Claims, 4 Drawing Sheets

PHASE-CHANGE RANDOM ACCESS MEMORY DEVICE HAVING MULTI-LEVELS AND METHOD OF MANUFACTURING THE SAME

CROSS-REFERENCES TO RELATED APPLICATION

The present application claims priority under 35 U.S.C. 119(a) to Korean application number 10-2012-0028379, filed on Mar. 20, 2012, in the Korean Patent Office, which is incorporated by reference in its entirety.

BACKGROUND OF THE INVENTION

1. Technical Field

The inventive concept relates to a nonvolatile memory device and a method of manufacturing the same, and more particularly, to a phase-change random access memory (PCRAM) device and a method of manufacturing the same.

2. Related Art

A lot of effort has been placed in realizing nonvolatile memory devices, such as PCRAMs, having a multi-level structure, while minimizing changes in a memory cell structure.

As part of this effort, technology for realizing the multi-levels by changing a degree of phase-change in a phase-change material by supplying a write voltage to a bit line of the PCRAMs step-by-step, has been suggested.

However, it is difficult to read out an accurate value in the PCRAM when the write voltage has been supplied step-by-step, as described above.

That is, in a high-integration PCRAM, adjacent memory cells, particularly cells connected to the same bit line, are formed close to one another. Thus, these cells are vulnerable to disturbance from a adjacent memory cells. Even when the write voltage is supplied step-by-step, a desired phase-change is not caused due to an effect of the adjacent memory cells. Thus, it is difficult to verify the memory cells and to realize a multi-level structure.

SUMMARY

According to one aspect of an exemplary embodiment there is a provided a PCRAM device. The PCRAM device may include: a heating electrode having an upper surface protruding in a stepped shape and a phase-change material layer formed in a phase-change space on the heating electrode, the phase-change material layer having a plurality of portions having thicknesses corresponding to the stepped shape of the heating electrode.

According to another aspect of an exemplary embodiment, there is a provided a PCRAM device. The PCRAM device may include: a semiconductor substrate including a word line extending in one direction; a first interlayer insulating layer formed on the substrate; a switching element formed in the first interlayer insulating layer, the switching element being electrically connected to the word line; a second interlayer insulating layer formed on the first interlayer insulating layer, the second interlayer insulating layer defining a phase-change space; a heating electrode formed in the phase-change space, the heating element being electrically connected to the switching element, and the heating element having a surface including a protrusion; a phase-change material layer disposed in the phase-change space on the heating electrode, the phase-change material layer having portions having different thicknesses corresponding to a height of the protrusion; and a bit line formed on the phase-change material layer.

According to another aspect of an exemplary embodiment, there is a provided a method of manufacturing a PCRAM device. The method may include: defining a phase-change space; forming a heating electrode having a step-shaped stepped protrusion, where the step-shaped protrusion defines on a boundary of the phase-change space; and forming, in the phase-change space, a phase-change material layer in the phase-change space on the step-shaped protrusion of the heating electrode.

These and other features, aspects, and embodiments are described below in the section entitled "DETAILED DESCRIPTION".

BRIEF DESCRIPTION OF THE DRAWINGS

The above aspects, features, and advantages of the subject matter of the present disclosure will be more clearly understood from the following detailed description taken in conjunction with the accompanying drawings, in which.

DETAILED DESCRIPTION

Figure 1:
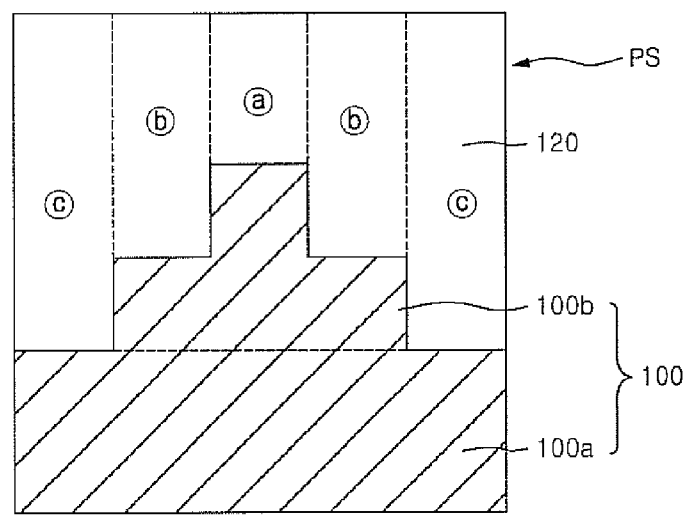
FIG. 1 is a cross-sectional view illustrating a heating electrode structure and a phase-change material layer structure in a PCRAM device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Referring to FIG. 1, a PCRAM device includes a heating electrode 100. The heating electrode 100 includes a body portion 100a and a stepped protrusion 100b formed on the body 100a.

Since the stepped protrusion 100b is formed in a phase-change space PS, the phase-change space PS has partially different heights. A phase-change material layer 120 is formed within the phase-change space PS having the partially different heights. The phase-change material layer 120 may include a single material and be formed through a single deposition process. The phase-change material layer 120 has partially different thicknesses by a structure of the heating electrode 100.

At this time, a portion ⓐ, having a relatively small thickness, of the phase-change material layer 120 is first phase changed and portions ⓑ and ⓒ having a relatively small thickness are sequentially phase changed. Therefore, the phase-change material layer 120 is phase changed in a step-by-step manner, so that multi-levels are realized.

Figure 2:
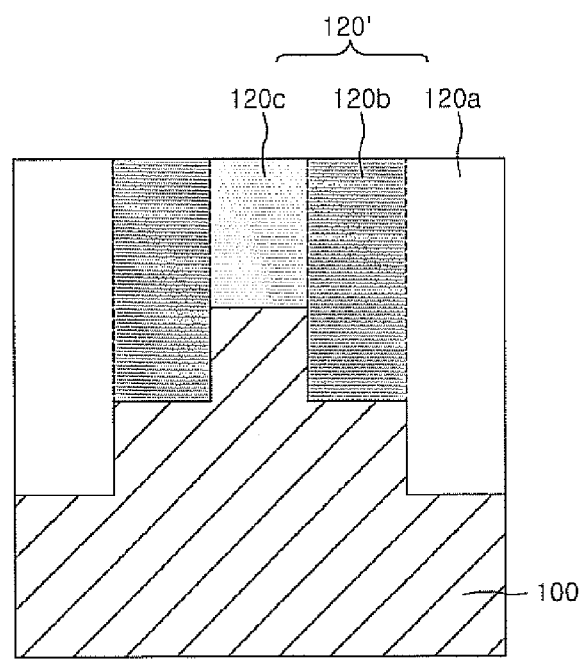
FIG. 2 is a cross-sectional view illustrating a heating electrode structure and a phase-change material layer structure in a PCRAM device according to another exemplary embodiment of the inventive concept.

To produce a more precise phase change of the phase-change material layer, the phase-change material layer 120 may be formed of partially different materials, as shown in FIG. 2. The phase-change material layer 120 may be formed of a first phase-change material layer 120a in edge portions, that is, the ⓒ portions of the phase-change space PS. The phase-change material layer 120 may also be formed of a second phase-change material layer 120b in the ⓑ portions of the phase-change space PS. The phase-change material layer 120 also may be formed of a third phase-change material layer 120c in the ⓐ portion of the phase-change space PS.

At this time, the multi-levels may be precisely defined by setting the first phase-change material layer 120a to have the highest phase-change temperature and setting the third phase-change material layer 120c to have the lowest phase-change temperature.

Figure 3A:
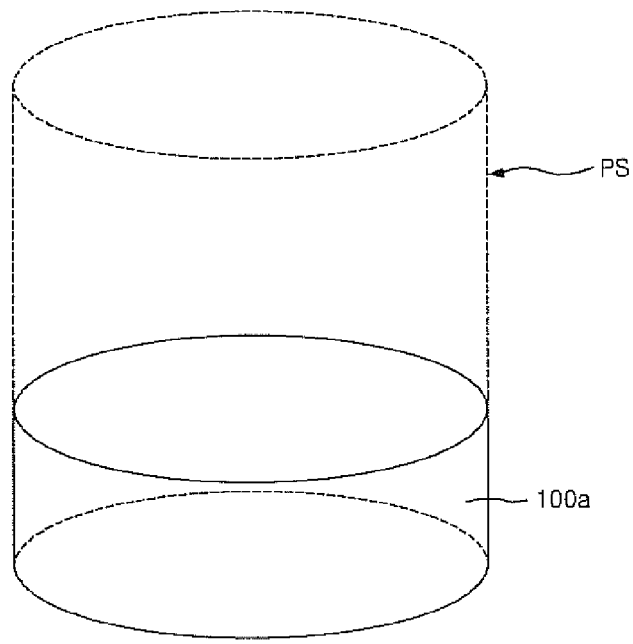
FIGS. 3A to 3C are perspective views illustrating a method of manufacturing a PCRAM device according to an exemplary embodiment of the inventive concept.
Figure 3B:
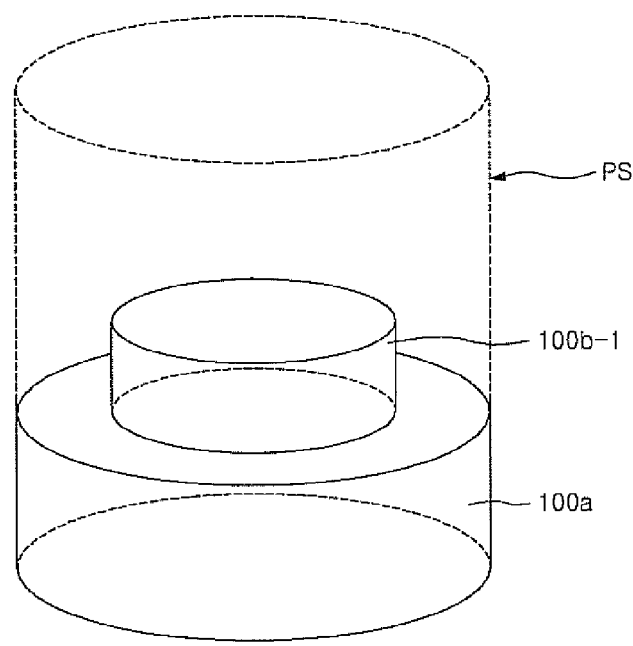
Figure 3C:
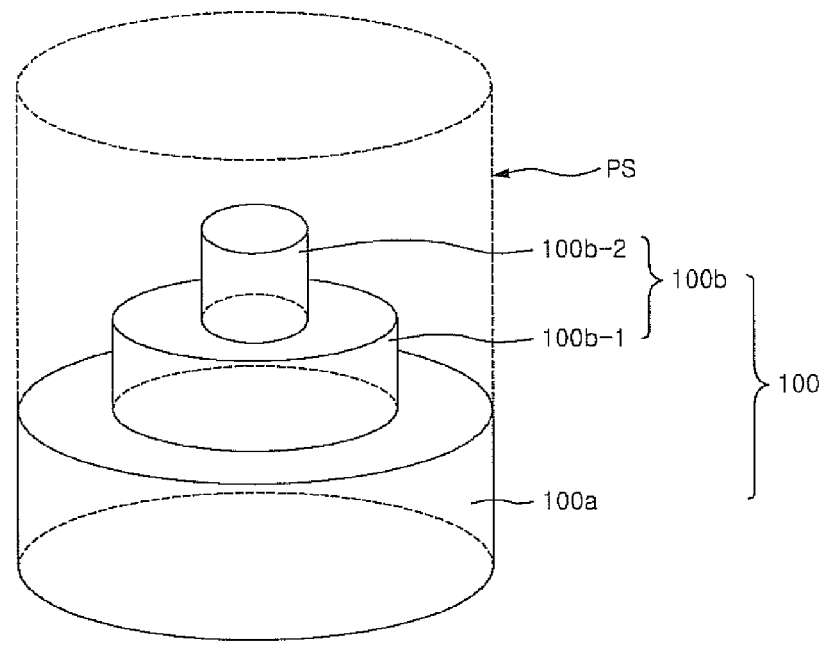

FIGS. 3A to 3C are perspective views illustrating a method of forming a heating electrode according to an exemplary embodiment of the inventive concept.

Referring to FIG. 3A, a disc-shaped first heating electrode 100a is formed within a phase-change space PS. A diameter of the first heating electrode 100a is substantially the same as that of the phase-change space PS.

Referring to FIG. 3B, a second heating electrode 100b-1 is formed on the first heating electrode 100a. The second heating electrode 100b-1 may have a disc shape and may have a smaller diameter than the first heating electrode 100a. The second heating electrode 100b-1 may be arranged on a central portion of the first heating electrode 100a.

Referring to FIG. 3C, a third heating electrode 100b-2 is formed on the second heating electrode 100b-1. The third heating electrode 100b-2 may have a smaller diameter than the second heating electrode 100b-1 and may be arranged on a central portion of the second heating electrode 100b-1. Therefore, the stepped heating electrode may be formed.

Figure 4:
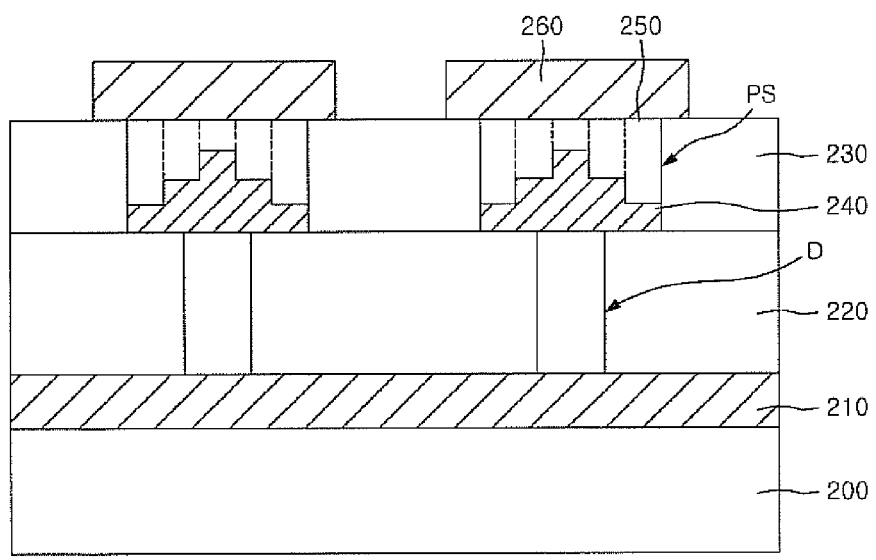
FIG. 4 is a cross-sectional view illustrating a PCRAM device according to an exemplary embodiment of the inventive concept.

FIG. 4 is a cross-sectional view of a PCRAM device according to an exemplary embodiment.

Referring to FIG. 4, a word line 210 is formed on a semiconductor substrate 200. The word line 210 is electrically insulated from the semiconductor substrate 200 and includes a polysilicon layer including impurities or a metal layer.

A first interlayer insulating layer 220 is formed on the semiconductor substrate 200, in which the word line 210 is formed, and a diode D is formed in a predetermined portion of the interlayer insulating layer 220. The diode D may be formed to be in contact with the word line 210. The diode D may include a PN diode or a Schottky diode according to a material of the word line 210.

A second interlayer insulating layer 230 is formed on the first interlayer insulating layer 220. A predetermined portion of the second interlayer insulating layer 230 is etched to form a phase-change space PS. A heating electrode 240 is formed on a bottom of the phase-change space PS through the above-described method. The heating electrode 240 may be formed through a stepped type etching method other than the above-described etching method. Although not shown, an ohmic contact layer may be interposed between the diode D and the heating electrode 240.

A phase-change material layer 250 is buried within the phase-change space PS on the heating electrode 240. The phase-change material layer 250 may be formed of a single phase-change material. Alternatively, the phase-change material layer 250 may be formed of different materials for steps of the heating electrode 240.

A bit line 260 is formed on the phase-change material layer 250. The bit line 260 may extend in a direction substantially perpendicular to the word line 210 and an upper electrode (not shown) may be interposed between the bit line 260 and the phase-change material layer 250.

Figure 5:
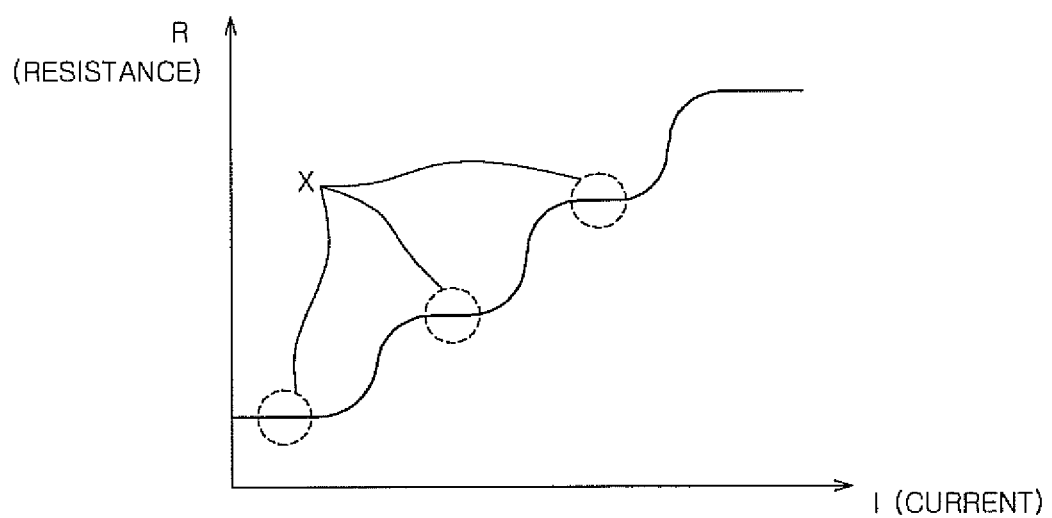
FIG. 5 is a graph illustrating a phase-change curve of a PCRAM device according to the second exemplary embodiment of the inventive concept.

When a predetermined current is applied to the PCRAM device, a plurality of temperature-induced phase-changes are caused based on a thickness, or composition, of the phase-change material layer 250, as shown in FIG. 5. In FIG. 5, an x-axis indicates current and a y-axis indicates resistance. A symbol "X" denotes a phase-change period.

Accordingly, the PCRAM may be precisely verified by supplying a constant write voltage, which is difficult to control in a conventional PCRAM.

The inventive concept is not limited to the above-described exemplary embodiment.

The exemplary embodiment has described that the phase-change space PS, in which the heating electrode and the phase-change material layer are formed, is configured in a cylindrical shape, but the structure of the phase-change space PS is not limited thereto. The phase-change space PS may be formed in various shapes, such as a square pillar or a trigonal prism.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase-change random access memory (PCRAM) device, comprising:
   a heating electrode having an upper surface protruding in a stepped shape; and
   a phase-change material layer formed in a phase-change space on the heating electrode, the phase-change material layer having a plurality of portions having thicknesses corresponding to the stepped shape of the heating electrode,
   wherein the heating electrode comprises:
      a first heating electrode portion formed in a lower portion of the phase-change space;
      a second heating electrode portion formed on the first heating electrode portion and having a smaller diameter than the first heating electrode portion; and
      a third heating electrode portion formed on the second heating electrode portion and having a smaller diameter than the second heating electrode portion.

2. The PCRAM device of claim 1, wherein a diameter of the first heating electrode portion is the same as a diameter of the phase-change space.

3. The PCRAM device of claim 1 wherein the second heating electrode portion is arranged on a central portion of the first heating electrode portion.

4. The PCRAM device of claim 1, wherein the third heating electrode portion is arranged on a central portion of the second heating electrode portion.

5. The PCRAM device of claim 1, wherein the phase-change material layer comprises a single compound.

6. The PCRAM device of claim 1, wherein one or more of the plurality of portions of the phase-change material layer is formed of a different material than other ones of the plurality of portions of the phase-change material layer.

7. The PCRAM device of claim 6, wherein those of the plurality of portions the phase-change material layer, corresponding to a lowest step of the stepped-shaped heating electrode, have a higher phase-change temperature than those of the plurality of portions of the phase-change material layer corresponding to a highest step of the stepped-shaped heating electrode.

8. A phase-change random access memory (PCRAM) device, comprising:
 a semiconductor substrate including a word line extending in one direction;
 a first interlayer insulating layer formed on the substrate;
 a switching element formed in the first interlayer insulating layer, the switching element being electrically connected to the word line;
 a second interlayer insulating layer formed on the first interlayer insulating layer, the second interlayer insulating layer defining a phase-change space;
 a heating electrode formed in the phase-change space, the heating element being electrically connected to the switching element, and the heating element having a surface including a protrusion;
 a phase-change material layer disposed in the phase-change space on the heating electrode, the phase-change material layer having portions having different thicknesses corresponding to a height of the protrusion; and
 a bit line formed on the phase-change material layer,
 wherein the heating electrode comprises:
  a first heating electrode portion formed on a lower portion of the phase-change space;
  a second heating electrode portion formed on the first heating electrode portion and having a smaller diameter than the first heating electrode portion; and
  a third heating electrode portion formed on the second heating electrode portion and having a smaller diameter than the second heating electrode portion.

9. The PCRAM of claim 8, wherein the protrusion comprises a plurality of steps of different heights.

10. The PCRAM device of claim 8, wherein the phase-change material layer comprises:
 a first phase-change material layer portion disposed on the first heating electrode portion;
 a second phase-change material layer portion disposed on the second heating electrode portion; and
 a third phase-change material layer portion disposed on the third heating electrode portion.

11. The PCRAM device of claim 10, wherein the phase-change material layer is formed so that a phase-change temperature of the phase-change material layer is increased in an order of the first phase-change material layer portion, the second phase-change material layer portion, and the third phase-change material layer portion.

12. The PCRAM device of claim 8, wherein the phase-change material layer comprises a single compound.

13. A method of manufacturing a phase-change random access memory (PCRAM) device, the method comprising:
 defining a phase-change space;
 forming a heating electrode having a step-shaped protrusion, where the step-shaped protrusion defines a boundary of the phase-change space; and
 forming, in the phase-change space, a phase-change material layer on the step-shaped protrusion of the heating electrode,
 wherein forming the heating electrode having a step-shaped further comprises:
  forming, within the phase-change space, a first heating electrode portion having a first diameter;
  forming, on the first heating electrode portion, a second heating electrode portion having a second diameter that is smaller than the first diameter; and
  forming, on the second heating electrode portion, a third heating electrode portion having a third diameter that is smaller than the second diameter.

14. The method of claim 13, wherein forming the phase-change material layer further comprises:
 forming a phase-change material layer portion on the first heating electrode portion;
 forming a second phase-change material layer portion on the second heating electrode portion; and
 forming a third phase-change material layer portion on the third heating electrode portion.

* * * * *